(12) United States Patent
Rouaissia

(10) Patent No.: US 12,107,575 B2
(45) Date of Patent: Oct. 1, 2024

(54) ENVIRONMENTAL SENSOR CIRCUIT HAVING A CAPACITIVE PROXIMITY SENSOR AND MAGNETIC FIELD PROBE

(71) Applicant: Semtech Corporation, Camarillo, CA (US)

(72) Inventor: Chaouki Rouaissia, Neuchâtel (CH)

(73) Assignee: SEMTECH CORPORATION, Camarillo, CA (US)

( * ) Notice: Subject to any disclaimer, the term of this patent is extended or adjusted under 35 U.S.C. 154(b) by 111 days.

(21) Appl. No.: 17/894,837

(22) Filed: Aug. 24, 2022

(65) Prior Publication Data

US 2023/0098109 A1 Mar. 30, 2023

Related U.S. Application Data

(60) Provisional application No. 63/249,770, filed on Sep. 29, 2021.

(51) Int. Cl.
*G01B 7/14* (2006.01)
*H03K 17/95* (2006.01)
*H03K 17/955* (2006.01)

(52) U.S. Cl.
CPC ............ *H03K 17/955* (2013.01); *G01B 7/14* (2013.01); *H03K 17/9512* (2013.01); *H03K 17/9517* (2013.01)

(58) Field of Classification Search
CPC ...... G01B 7/14; H03K 17/95; H03K 17/9512; H03K 17/9517; H03K 17/955; H03K 17/97; H03K 2017/9713; H04B 1/16; H04M 1/026; H04M 2250/12
See application file for complete search history.

(56) References Cited

U.S. PATENT DOCUMENTS

| 5,220,324 | A  | * | 6/1993  | Morita      | G06F 3/046  |
|           |    |   |         |             | 341/32      |
| 9,144,041 | B2 | * | 9/2015  | Curtis      | H04W 52/283 |
| 9,197,271 | B2 | * | 11/2015 | Peter       | H04W 64/00  |
| 9,979,389 | B2 |   | 5/2018  | Van Ausdall et al. | |
| 10,298,280 | B2 |  | 5/2019  | Nys et al.  |             |
| 10,423,278 | B2 | * | 9/2019  | Rouaissia   | H03K 17/955 |

(Continued)

FOREIGN PATENT DOCUMENTS

EP 2988479 A1 2/2016
EP 3016295 A1 5/2016

(Continued)

OTHER PUBLICATIONS

Notice of Preliminary Rejection dated Dec. 21, 2023 in application KR10-2022-0123022, 5 pages.

(Continued)

*Primary Examiner* — Vinh P Nguyen
(74) *Attorney, Agent, or Firm* — BLANK ROME LLP

(57) ABSTRACT

Environmental sensor circuit for a portable connected wireless device. The circuit includes a capacitive proximity sensor that determines when a user is close to the portable device. The device also has a magnetic field probe that provides a signal that indicates the position of a permanent magnet. The sensor circuit integrates both a digitizing unit and digital signal processing for the suppression of noise and drive in signals coming from the proximity sensor and from the magnetic field probe.

12 Claims, 3 Drawing Sheets

(56) References Cited

U.S. PATENT DOCUMENTS

| | | |
|---|---|---|
| 10,444,916 B2 * | 10/2019 | Unseld ................. G06F 3/0445 |
| 11,693,067 B2 | 7/2023 | Shunji et al. |
| 2013/0087868 A1 | 4/2013 | Maerz et al. |
| 2013/0157564 A1 | 6/2013 | Curtis et al. |
| 2017/0235386 A1 | 8/2017 | Almholt |
| 2018/0331706 A1 | 11/2018 | Nys |
| 2020/0195289 A1 | 6/2020 | Chang |
| 2020/0256934 A1 | 8/2020 | Saruki |

FOREIGN PATENT DOCUMENTS

| | | |
|---|---|---|
| EP | 3293953 A1 | 3/2018 |
| EP | 3404835 A1 | 11/2018 |
| EP | 3416031 A1 | 12/2018 |
| EP | 3422577 A1 | 1/2019 |
| EP | 3595175 A1 | 1/2020 |
| EP | 3595176 A1 | 1/2020 |
| JP | 2002282234 A | 10/2002 |
| JP | 2020512625 | 4/2020 |
| JP | 2020134158 | 8/2020 |
| JP | 2020134158 A | 8/2020 |
| KR | 1020180124699 A | 11/2018 |
| WO | 2018164835 | 9/2018 |

OTHER PUBLICATIONS

Semtech—Ultra Low Power, Smart Proximity Sensor for SAR—SX9324—www.semtech.com; Oct. 2017; 47 pgs.
European Search Report for EP 22198143 dated Feb. 8, 2023, 2 pgs.
Office Action, JP2022-133318, Issued Aug. 10, 2023.
Office Action in counterpart JP2022-133318, English summary, 5 pages, May 16, 2024.

* cited by examiner

ENVIRONMENTAL SENSOR CIRCUIT HAVING A CAPACITIVE PROXIMITY SENSOR AND MAGNETIC FIELD PROBE

RELATED APPLICATION

This application claims benefit to U.S. Provisional Application No. 63/249,770, filed on Sep. 29, 2021. The entire contents of this application is hereby incorporated by reference in its entirety.

TECHNICAL DOMAIN

The present invention concerns an environmental sensor and a circuit for processing environmental data, both suitable for application in a connected portable device, such as a portable phone, a tablet, or a laptop computer.

RELATED ART

Connected portable devices require an amount of environmental awareness to fulfil their missions. The applications are too numerous to be exhausted here. There are for example known portable phones equipped with proximity detectors, temperature detectors, accelerometers, light level meters, hall sensor detectors, and many other. Environmental Information gathered from such sensors are used at many levels in portable devices. Proximity sensor may cause the phone to enter in a reduced-power mode. Hall sensor and light sensor can be used to determine whether the phone screen is exposed or covered and alter the user interface accordingly, and many others.

Known proximity sensors used in portable devices include capacitive sensors that determine whether (a part of) the user's body is close to the device. This information is important to determine whether the device is carried close to the body or is lying on a table or on a drawer. This information is used to comply with statutory SAR limits and to improve the use of the device. It is known for example to disable the touch screen during a call, if the capacitive proximity sensor in the telephone determines that the device is held close to the ear.

Capacitive proximity sensors are often proposed in the form of dedicated IC, with an analogue input connectable to a conductive pad, or to the RF antenna (via a decoupling circuit) whose capacity is sensed, and digital output of various kind for communication with a processing unit.

Hall sensors are used, among other applications, as contactless switches to determine the presence, absence, or position of a part in which are installed magnets or ferromagnetic elements. They are used for example to determine whether the screen is covered or exposed, if an accessory is in a charging cradle, or else to tell the position of a determined accessory or part. Such sensors take also often the form of dedicated ICs, which include the Hall semiconductor device itself, an analogue front end to amplify the weak magnetic signal, discriminators and drivers providing a digital signal suitable for a microcontroller or a microprocessor.

Capacitive proximity sensors are described, among others, by patents EP2988479B1, EP3293953B1, EP3404835B1, U.S. Pat. Nos. 10,423,278B2, 10,298,280B2, 9,979,389B2, EP3416031B1 and patent applications EP3422577A1, EP3595175A1, EP3595176A1 assigned to the applicant.

SHORT DISCLOSURE OF THE INVENTION

An aim of the present invention is the provision of an environmental sensor circuit for a portable wireless device including both a capacitive proximity sensor configured for determining whether a user is in proximity with its body to the portable connected wireless device, by sensing variation in the capacitance of an electrode in electric connection with the environmental integrated circuit, and a Hall-effect probe providing a signal proportional to a magnetic field strength. The environmental integrated circuit also comprises an analogue/digital converter configured to produce proximity digital values representative of the capacitance of the electrode and magnetic field digital values representative of the magnetic field strength, and a digital processor configured for suppressing unwanted noise and drift components from the proximity digital values and from the magnetic field digital values.

Preferably, the inventive environmental sensor circuit may comprise a magnetic field digital output, configured to switch from a logical state to an opposite logical state when the magnetic field sensed by the Hall-effect probe exceeds a predetermined threshold, and/or a digital bus output for communicating values of proximity and magnetic field to a host system, and/or an interrupt output for requesting the action of a host system when the values of proximity and/or magnetic field meet predetermined conditions.

The environmental integrated circuit may be configured to wake up a host system when a predetermined combination of magnetic field and proximity status is detected.

The digital processor of the environmental integrated circuit may comprise a nonlinear filter.

The digital processor of the environmental integrated circuit may comprise a baseline and drift suppression unit.

The environmental integrated circuit may be configured to subtract at least a part of a baseline component from an analogue signal presented at the input of the analogue/digital converter.

A wireless portable connected device comprising the environmental integrated circuit may be configured to reduce a RF power when the integrated circuit determine a proximity with the user and the sensitivity of the proximity sensor is variable dependent on the magnetic field strength.

The user interface of a wireless portable connected device including the environmental integrated circuit may be programmed to change its behaviour dependent from the magnetic field strength.

SHORT DESCRIPTION OF THE DRAWINGS

Exemplar embodiments of the invention are disclosed in the description and illustrated by the drawings in which.

EXAMPLES OF EMBODIMENTS OF THE PRESENT INVENTION

Figure 1:
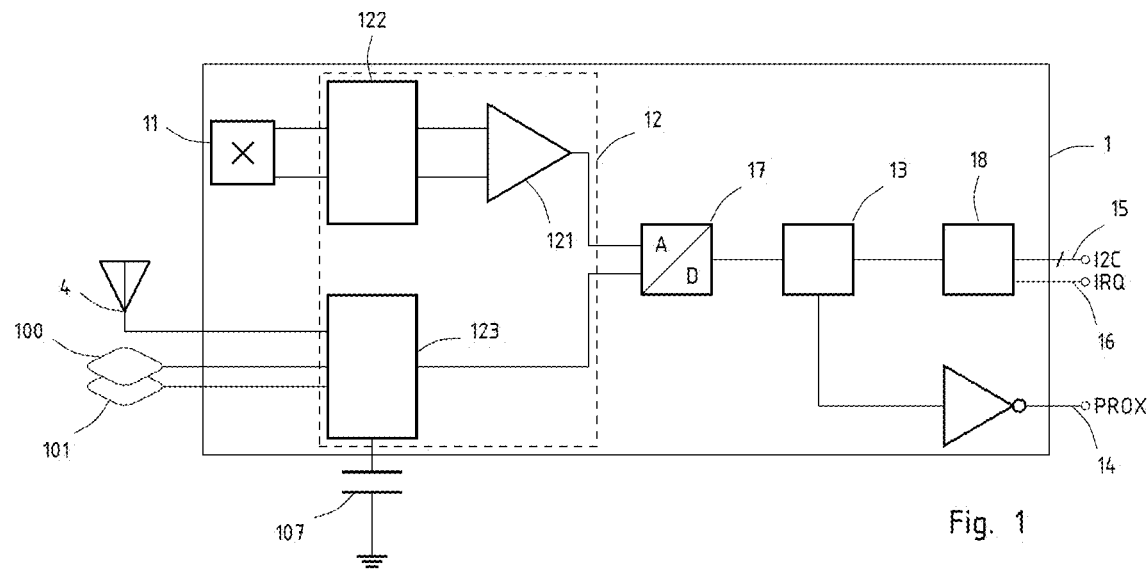
FIG. 1 illustrates schematically a possible realization of an environmental integrated circuit according to the invention.

FIG. 1 shows schematically an environmental integrated circuit 1 for detecting and processing proximity and magnetic field signals. Proximity signals arise from relative movements of the user in the environment of the portable device supporting the integrated circuit such as for example, the act of putting the portable device in a pocket or bringing it close to the head to make a phone call. Magnetic field signals may arise from a position change of an accessory, like a cover.

The environmental integrated circuit 1 illustrated in FIG. 1 comprises one or several capacitive proximity inputs that detects variations in the capacitance of conductors connected to the integrated circuit when, for example, a part of a user's body approaches the electrode or is taken away from it. The number of capacitive inputs is determined by the application and by the number of available pins in the integrated circuit.

Several arrangements of conductors can be used as proximity-sensing electrode in the frame of the invention, provided they are capable of coupling via electric induction with an approaching conductive or dielectric body. The circuit of the invention can have several terminals for connecting to a plurality of electrodes, that can be used to perform directional sensing, to provide screening electrodes, or to improve the overall sensitivity to approaching conductive or dielectric bodies. The proximity-sensing electrode may be a track or a conductive surface on a printed circuit board, possibly the same printed circuit board on which the integrated circuit of the invention is soldered. The capacitive electrode may have other functions besides the proximity sensing. For example, it may be a structural metallic element of the device, or a (part of a) radiofrequency antenna for example a Wi-Fi™ antenna, a Bluetooth® antenna, or an antenna for a cellular phone network.

In variants, one capacitive input of the circuit of the invention can be connected to a reference capacitance that is not influenced by conductive or dielectric bodies moving close or retreating but is still influenced by changes of temperature. This signal can be used as a sensitive thermometer for correcting a temperature drift and improve the detection of proximity.

In the figure, that must be taken as exemplificative rather than limitative, the integrated circuit 1 has four capacitive inputs: one used to read the capacitance of a radiofrequency antenna 4 (via a non-represented decoupling impedance), two more to read respectively a sense patch 100 and a shield patch 101 on a printed circuit board, and a fourth one connected to a reference capacitance107.

The capacitive inputs are connected to an analogue front-end section 12 of the integrated circuit 1. The analog front-end comprises a capacitive readout and control circuit 123 that is configured to convert the self-capacitance seen at the inputs to an analog signal suitable for conversion into a digital value, for example a voltage level. Such a conversion can be obtained in several ways, as disclosed for example in the documents identified in the "related art" section. Preferably, the readout and control circuit 123 connects to the capacitive inputs one by one. The readout and control circuit 123 can be controlled such that, while it is connected to one input, the other inputs can be selectively set in a high-impedance state (floating), in a low-impedance state (grounded) or at the same potential as the input that is read in that moment (shield mode).

The integrated circuit further comprises a magnetic field transducer 11 that is configured to detect variations in a magnetic field in the proximity of the integrated circuit 1 caused for example by the movement of a magnet included in a smartphone or tablet case.

The magnetic field sensor may include any suitable transducer capable of generating an electric signal related to the local intensity of magnetic field. Hall-effect semiconductors are prevalent in the art, but other sensors are available and may be used in the frame of the invention. Specifically, the invention may use MEMS magnetometers, magneto-resistive sensors, fluxgate sensors, or pick-up coils. Some magnetic transducers, notably Hall-effect devices, can be advantageously integrated in the same die on which the integrated circuit of the invention is fabricated. The invention includes however variants in which the magnetic sensor and the environmental sensor circuit of the invention are fabricated on separate chips, in the same package or in separate interconnected packages.

The following description will refer to an embodiment with a Hall-effect semiconductor probe, which is a very popular implementation, but this should not be intended as a limitation of the invention.

The analog front-end section 12 comprises an offset correction unit 122 and an amplifier 121 that are configured to bring the voltage signal generated by the Hall sensor 11 to a level matching the input range of the analog to digital converter 17, as the output of the Hall sensor can be quite small.

The analogue proximity signals detected by the capacitive proximity sensor and by the Hall-effect probe are converted in a digital capacitive proximity signal and a digital magnetic signal by a shared analogue/digital converter (A/D converter) 17. The measurements made by the capacitive proximity circuit 123 and the Hall-effect probe 11 are time-multiplexed.

Figure 2:
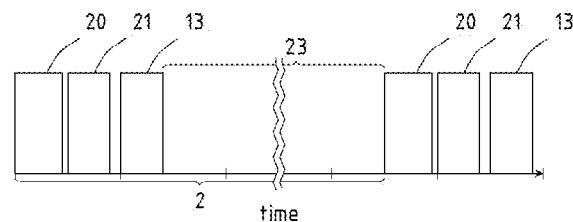
FIG. 2 illustrates schematically a graph of a scan period of an analogue/digital converter.

In a particular embodiment illustrated in FIG. 2, an A/D converter 17 is configured for having a recurrent scanning period 2 comprising
measuring a capacitance 20 with the capacitive proximity sensor while the Hall-effect probe is turned off,
measuring a magnetic field 21 with the Hall-effect probe sensor while the capacitive sensor is turned off,
converting the analogue signal 22 obtained from the capacitance and Hall-effect measurement into a digital signal,
being idle 23 for a determined period of time.
This configuration of the A/D converter prevents interferences between the analogue capacitive signal and the analogue magnetic signal.

The inventive circuit also comprises a digital processor for processing the digital proximity and magnetic signals produced by the analogue/digital converter. The digital processor is configured for suppressing unwanted noise and/or drift components from the proximity digital values and from the magnetic field digital values. In the embodiment illustrated in FIG. 1, the digital processor 13 follows the A/D converter 17.

Figure 3:
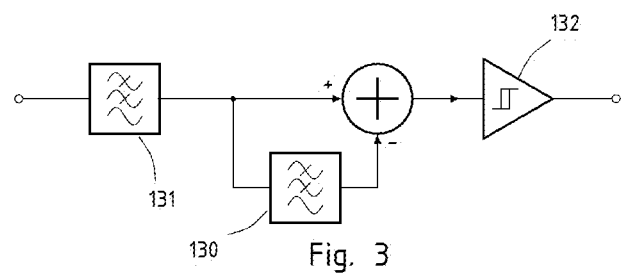
FIG. 3 illustrates schematically a part of a digital processor used to reduce noise and baseline drifts in embodiments of the invention.

In a particular embodiment illustrated in FIG. 3, the digital processor 13 includes a drift filter 130 and a noise filter 131. The drift filter is used to discriminate a legitimate variation of the measured capacitance, such as the approach of a user, from drifts that may arise for example from a variation of temperature around the capacitive proximity sensor. The noise filter is used to suppress the unwanted white noise arising from the natural electric and magnetic activity around the sensors.

The drift filter 130 may comprise a baseline and drift suppression unit 1300. The baseline is a spurious value that is constant or slowly drifting. This baseline may be due the background capacity of the electrode and as the change in the capacitance due to the approach of a user body part may be several times small than this background capacity, it may be crucial to filter the baseline to identify proximity signals. The baseline and drift suppression unit can be configured for subtracting a baseline component from an analogue signal presented at the input of the A/D converter. The amount of baseline subtraction is individually adjustable for the capacitive channels and the magnetic readout channel. The desired level of subtraction may be adjusted digitally by writing into registers of the inventive device, for example via a digital device interconnection bus, such as I2C, I3C, or SPI, adjusted autonomously by the circuit of the invention, or adapted in any suitable way. Advantageously, the drift suppression unit is configured to suppress or limit the drifts arising for example from a thermal variation.

As illustrated in FIG. 3, the digital processor 13 may comprise a first low pass filter 131 configured for removing a standard electric or magnetic noise from a signal, a second low pass filter 130 configured for removing a baseline and drift from the signal, a comparison processing block 132 configured for determining if the signal belongs to a range of predetermined admissible signals, a digital discriminator 133 configured for converting a digital signal that has been admitted into a binary proximity information.

The environmental integrated circuit may comprise a two-value digital output configured to switch from a logical state to an opposite logical state when the magnetic field sensed by the Hall-effect probe exceeds a predetermined threshold. In the aforementioned example of the smartphone case, the threshold may be determined so that a magnetic field exceeding the threshold corresponds to a closed case as a magnet included in the case is brought near the Hall-effect probe, and a magnetic field below the threshold corresponds to an open smartphone case as the magnet is far from the Hall-effect probe. In the embodiment of the integrated circuit illustrated in FIG. 1, the two-value digital output 14 is in electric connection with the digital processor 13.

The environmental integrated circuit may also comprise a digital bus output for communicating values of proximity and magnetic field to a host system. The digital bus output may be an inter-integrated circuit (I2C) or any suitable type of digital bus output. In the embodiment illustrated in FIG. 1, a digital bus output 15 is in electric connection with the digital processor 13.

The environmental integrated circuit may also comprise an interrupt output for requesting the action of a host system when the values of proximity and/or magnetic field meet predetermined conditions.

Figure 4:
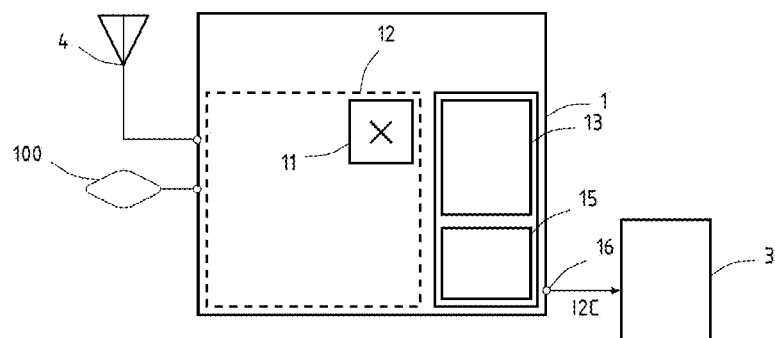
FIGS. 4 and 5 illustrate schematically embodiments of the invention.

In an embodiment illustrated in FIG. 4, the environmental integrated circuit 1 comprises a I2C digital bus output 15 connected to a host system 3 and a shared interrupt output 16. If a variation in the proximity and/or magnetic field value is detected, then the interrupt output 16 goes low and the host system 3 is communicated the proximity and magnetic field value to identify which value has changed. In this embodiment, the electrode 100 connected to the proximity sensor 123 is included in the integrated circuit.

Figure 5:
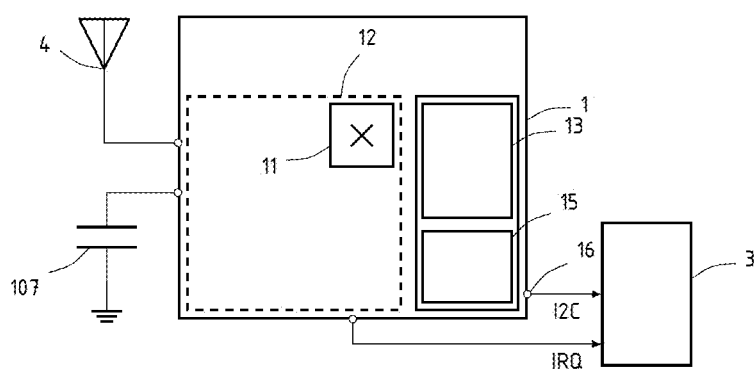

In another embodiment illustrated in FIG. 5 the environmental integrated circuit 1 comprise a I2C digital bus output 15 connected to a host system 3, an interrupt output 16 and a binary digital output two-value digital output 14. While the interrupt output 16 is dedicated to send a signal to the host system 3 if a variation in the proximity signal is sensed, the binary digital output 14 switches from a logical state to the opposite, i.e. from 0 to 1 or from 1 to 0, if a variation of the magnetic field exceeds a given threshold. In this embodiment, the electrode 100 is external to the circuit and connected to the capacitive proximity sensor 123.

The environmental integrated circuit may be configured to wake up a host system when a predetermined combination of magnetic field and proximity status is detected. This functionality can be used for example to lock the screen of a smartphone when a user is approaching his head from the smartphone to give a call, or to activate the screen when a smartphone case is opened. However, these are not the only examples of applications.

In a particular embodiment, a wireless portable connected device is configured for reducing a RF power when the integrated circuit determines a proximity with the user. This allows for example to comply with daily body dose limits. The sensitivity of the proximity sensor can be configured to depend upon the magnetic field strength.

If the environmental integrated circuit is included in a wireless portable connected device comprising a user interface, such as for example a smartphone screen, the user interface may be programmed to modify its behaviour according to the strength of the magnetic field. This is typically the case when a smartphone or a tablet is protected by a foldable case covering the screen. Magnets included in the part of the case covering the screen induce a variation of the magnetic field as the cover is approached or brought away from the Hall-effect probe in the integrated circuit. According to the situation, the user interface may be programmed to allow an interaction with a user or alternatively to prevent any such interaction.

The embodiments of the invention disclosed so far use a magnetic field transducer that is responsive to a single component of the environmental magnetic field, in other words, a projection of the magnetic field vector B on a given direction. This is not an essential feature, however, and the invention is not limited to those realizations. Indeed, the magnetic field transducer could be a multi-axis sensor capable of determining two or three independent components of the magnetic vector, whereby the magnetic field can be reconstructed in a 2-dimensional plane or in a 3-dimensional space. In such cases, the environmental sensor circuit is configured to provide two or three magnetic field digital values, each representative of an independent component of the magnetic field strength.

Figure 6:
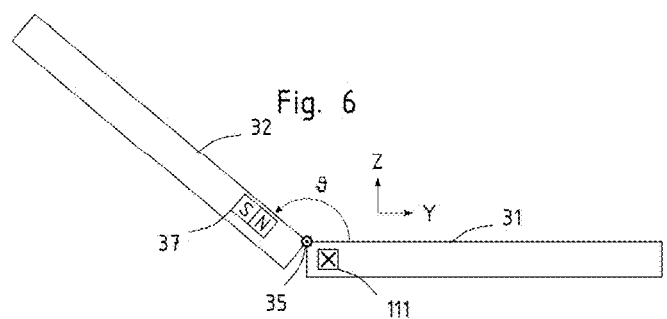
FIG. 6 shows in schematic very simplified way a foldable portable device comprising two hinged parts, wherein a multi-axis Hall transducer is used to determine a fold angle.

The multi-axis magnetic field measurement can be used advantageously to determine an angle between two mutually pivotable elements, one equipped with the inventive sensor and the other carrying a permanent magnet. FIG. 6 shows an example: a portable device has two elements 31 and 32 connected by a hinge 35, such that they can be open (folding angle $\vartheta = 180°$) or closed together ($\vartheta = 0°$). This arrangement is found in folding smartphones, for example. The first folding element 31 has a multi-axis Hall sensor 111, or another equivalent sensor for measuring the magnetic field, that is capable of measuring a horizontal component $B_y$ of the local magnetic field, a vertical component $B_z$ of the local magnetic field and, preferably, the second horizontal component $B_x$ that s orthogonal to $B_y$ and $B_z$ and is not visible in the drawing because it is orthogonal to the drawing plane. The other folding element has a permanent dipole magnet 37.

Figure 7:
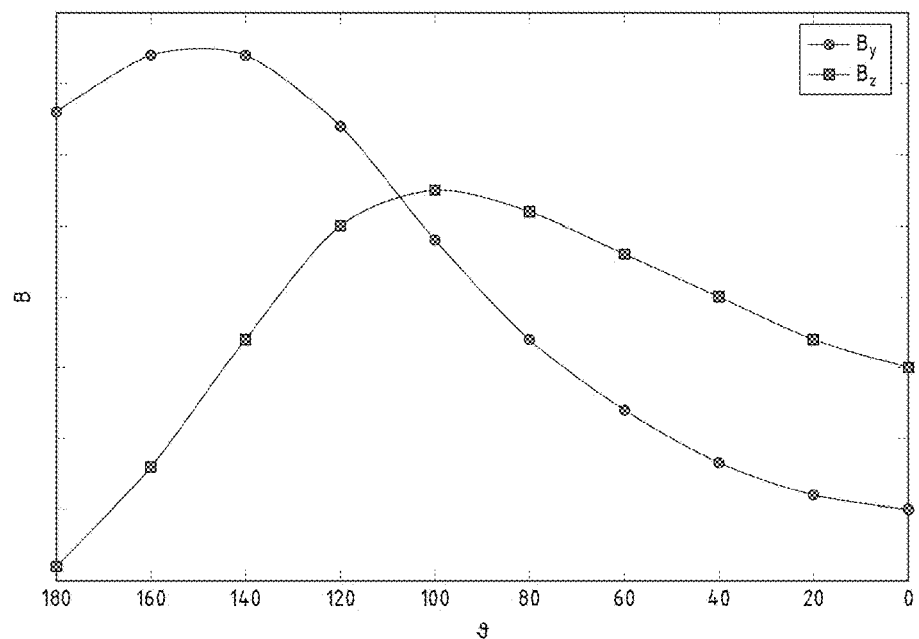
FIG. 7 is a plot showing components of the magnetic field available at the position of the Hall sensor, as a function of the fold angle.

When the folding elements are open or closed, such that the angle ϑ changes, this reflects in a change of the intensity and the direction of the magnetic field B seen by the sensor 111. The plot of FIG. 7 shows how the components $B_y$ and $B_z$ depend on the fold angle ϑ. The informed reader will appreciate that the shape of the curves is a result of a choice of the positions of the sensor 111 and of the magnet 37 and of the orientation of the latter in the element 32, and that other shapes could be obtained by changing these geometry parameters, without leaving the invention. Importantly, these geometry parameters can be chosen such that each possible value of the fold angle ϑ corresponds to a unique combination of $B_y$ and $B_z$, such that the circuit of the invention can be configured to compute the folding angle ϑ, or an approximate representation thereof, from $B_y$ and $B_z$. This can be obtained in many ways, for example by trigonometric calculation or through a double entry look-up table.

Figure 8:
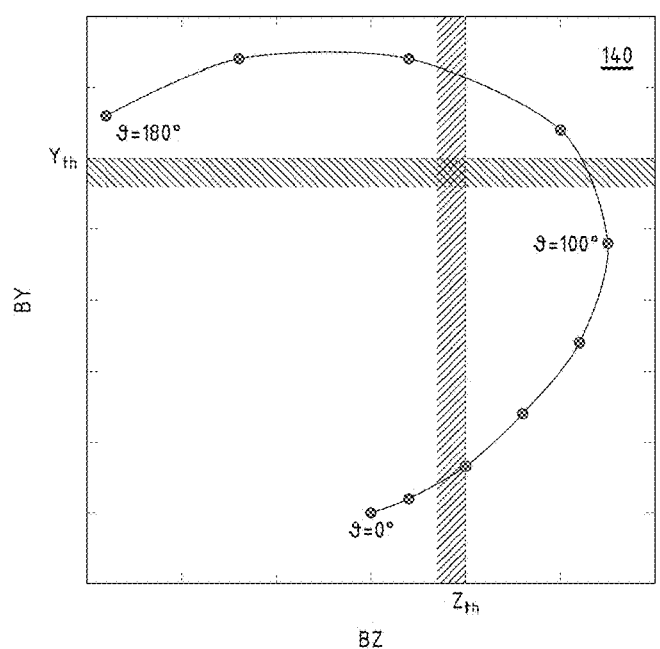
FIG. 8 illustrates a possible discrimination method.

In many situations, a precise knowledge of the folding angle ϑ is not necessary and it is sufficient to know when the angle ϑ is within a stated interval. In such cases, the circuit of the invention can be configured to compare the values of $B_y$ and $B_z$ with two threshold values $Y_{th}$ and $Z_{th}$ and raising a detection flag when both comparisons succeed. FIG. 8 shows in a plot the values of $B_y$ and $B_z$ in relation with the threshold values $Y_{th}$ and $Z_{th}$. The values $Y_{th}$ and $Z_{th}$ are chosen such that $B_y > Y_{th}$ and $B_z > Z_{th}$ when the representative point is in the region 140, that is to say, ϑ is approximatively between 110° and 130°. This method allows to determine when the folding angle is in the determined interval with a minimum of computations. Different angle intervals can be chosen by changing the threshold values, the sign of the comparison, or else rotating or changing the position of the magnet 37.

In variants of the above embodiment, the circuit of the invention may compare a combination of two components, for example $B_z + B_Y$ or $B_z - B_Y$ with fixed thresholds. This is equivalent to cutting the plot of FIG. 8 along lines at 45° to the axis.

As mentioned above, the Hall sensor 11 can he sensitive to two or three components of the magnetic field B. In the geometry taken as example, the component $B_x$ parallel to the folding axis is expected to be constant and conveys no information on the folding angle ϑ. It can be collected and used to check the good functioning of the sensor. The knowledge of the three-dimensional magnetic field can be used in other application, for example in an electronic compass application.

REFERENCE SYMBOLS USED IN THE FIGS.

1 environmental integrated circuit
2 scanning period
3 host system
4 antenna
11 Hall transducer
12 analog frontend
13 digital processing
14 digital output
15 bus output
16 interrupt
17 ADC
18 host interface
20 capacitance measure
21 magnetic field measure
22 A/D conversion
23 idle/wait period
31 first hinged part
32 second hinged part
35 hinge
37 magnet
100 capacitive electrode
101 shield electrode
107 reference capacitor
111 multi-axis Hall transducer
121 amplifier
122 offset compensation
123 capacitance to voltage converter
130 baseline and drift filter
131 noise filter
132 comparison block
133 digital discriminator

The invention claimed is:

1. An environmental sensor circuit for a portable connected wireless device, the circuit comprising: (a) a capacitive proximity sensor configured to determine whether a user is in proximity to the capacitive proximity sensor, by sensing variation in the capacitance of an electrode in electric connection with an environmental integrated circuit, (b) a magnetic field probe, providing a signal proportional to a magnetic field strength, wherein the environmental sensor circuit has an analogue/digital converter configured to produce proximity digital values representative of the capacitance of the electrode and magnetic field digital values representative of the magnetic field strength, the integrated circuit further comprising a digital processor configured for suppressing unwanted noise and drift components from the proximity digital values and from the magnetic field digital values.

2. The environmental sensor circuit according to claim 1, comprising a magnetic field digital output, configured to switch from a logical state to an opposite logical state when the magnetic field sensed by the magnetic field probe exceeds a predetermined threshold.

3. The environmental sensor circuit according to claim 1, wherein the digital processor comprises a nonlinear filter.

4. The environmental sensor circuit according to claim 1, wherein the digital processor comprises a baseline and drift suppression unit.

5. The environmental sensor circuit according to claim 4, the baseline and drift suppression unit being configured to subtract at least a part of a baseline component from an analogue signal presented at the input of the analogue/digital converter.

6. The environmental sensor circuit according to claim 1, in which the magnetic field probe is a Hall-effect device, and the environmental sensor circuit and the Hall-effect device are fabricated on a same semiconductor chip.

7. The environmental sensor circuit according to claim 1 in a wireless portable connected device, wherein the wireless portable connected device is configured to reduce a RF power of the wireless portable connected device when the integrated circuit determine a proximity with the user, wherein a sensitivity of the proximity sensor is variable dependent on the magnetic field strength.

8. The environmental sensor circuit according to claim 1, wherein the magnetic field probe is a multi-axis probe capable of detecting strengths of two or three independent components of the vectorial magnetic field.

9. The environmental sensor circuit according to claim 1, comprising a digital bus output for communicating values of proximity and magnetic field to a host system.

10. The environmental sensor circuit according to claim 1, comprising an interrupt output for requesting the action of a host system when the values of proximity and/or magnetic field meet predetermined conditions.

11. An environmental sensor circuit for a portable connected wireless device, the circuit comprising: (a) a capacitive proximity sensor configured to determine whether a user is in proximity to the capacitive proximity sensor, by sensing variation in the capacitance of an electrode in electric connection with an environmental integrated circuit, (b) a magnetic field probe, providing a signal proportional to a magnetic field strength, wherein the environmental sensor circuit has an analogue/digital converter configured to produce proximity digital values representative of the capacitance of the electrode and magnetic field digital values representative of the magnetic field strength, the integrated circuit further comprising a digital processor configured for suppressing unwanted noise and drift components from the proximity digital values and from the magnetic field digital values, the environmental sensor circuit further comprising a magnetic field digital output, configured to switch from a logical state to an opposite logical state when the magnetic field sensed by the magnetic field probe exceeds a predetermined threshold.

12. An environmental sensor circuit for a portable connected wireless device, the circuit comprising: (a) a capacitive proximity sensor configured to determine whether a user is in proximity to the capacitive proximity sensor, by sensing variation in the capacitance of an electrode in electric connection with an environmental integrated circuit, (b) a magnetic field probe, providing a signal proportional to a magnetic field strength, wherein the environmental sensor circuit has an analogue/digital converter configured to produce proximity digital values representative of the capacitance of the electrode and magnetic field digital values representative of the magnetic field strength, the integrated circuit further comprising a digital processor configured for suppressing unwanted noise and drift components from the proximity digital values and from the magnetic field digital values, the environmental sensor circuit further comprising a digital bus output for communicating values of proximity and magnetic field to a host system, and/or an interrupt output for requesting the action of a host system when the values of proximity and/or magnetic field meet predetermined conditions.

* * * * *